(12) United States Patent  
Uemura et al.

(10) Patent No.: US 8,965,149 B2
(45) Date of Patent: Feb. 24, 2015

(54) OPTOELECTRONIC INTEGRATED PACKAGE MODULE AND METHOD OF MANUFACTURING THE SAME

(71) Applicant: Kabushiki Kaisha Toshiba, Minato-ku, Tokyo (JP)

(72) Inventors: Hiroshi Uemura, Yokohama (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 13/839,930

(22) Filed: Mar. 15, 2013

(65) Prior Publication Data

US 2014/0044389 A1    Feb. 13, 2014

(30) Foreign Application Priority Data

Aug. 13, 2012   (JP) ................... 2012-179446

(51) Int. Cl.
```
G02B 6/12      (2006.01)
G02B 6/13      (2006.01)
G02B 6/42      (2006.01)
G02B 6/43      (2006.01)
```
(52) U.S. Cl.
  CPC .. *G02B 6/12* (2013.01); *G02B 6/13* (2013.01); *G02B 6/428* (2013.01); *G02B 6/4245* (2013.01); *G02B 6/43* (2013.01); *G02B 6/4246* (2013.01); *H01L 2224/16225* (2013.01); *H01L 2924/15311* (2013.01)

USPC .......................................................... 385/14

(58) Field of Classification Search
  USPC .......................................................... 385/14
  See application file for complete search history.

(56) References Cited

U.S. PATENT DOCUMENTS

| | | | |
|---|---|---|---|
| 7,489,514 B2 * | 2/2009 | Hamasaki et al. | 361/721 |
| 7,759,781 B2 * | 7/2010 | Furuyama et al. | 257/685 |
| 8,188,594 B2 * | 5/2012 | Ganesan et al. | 257/713 |
| 8,374,470 B2 * | 2/2013 | Ban et al. | 385/49 |
| 2004/0218372 A1 | 11/2004 | Hamasaki et al. | |

* cited by examiner

*Primary Examiner* — Sung Pak
(74) *Attorney, Agent, or Firm* — Holtz, Holtz, Goodman & Chick PC (57) ABSTRACT

According to one embodiment, there is provided an optoelectronic integrated package module including a silicon interposer, an optical semiconductor element formed in the silicon interposer, and a semiconductor integrated circuit chip module including a first semiconductor integrated circuit chip including a logic circuit and mounted on a first principal surface and a second semiconductor integrated circuit chip having a second principal surface side mounted on the silicon interposer. The first and second semiconductor integrated circuit chips are electrically connected to each other via the via interconnections formed inside the second semiconductor integrated circuit chip from the first principal surface. The first or second semiconductor integrated circuit chip receives an electrical signal obtained via the via interconnection by means of the unterminated reception circuit.

19 Claims, 9 Drawing Sheets

OPTOELECTRONIC INTEGRATED PACKAGE MODULE AND METHOD OF MANUFACTURING THE SAME

CROSS-REFERENCE TO RELATED APPLICATIONS

This application is based upon and claims the benefit of priority from Japanese Patent Application No. 2012-179446, filed Aug. 13, 2012, the entire contents of which are incorporated herein by reference.

FIELD

Embodiments described herein relate generally to an optoelectronic integrated package module and a method of manufacturing the same.

BACKGROUND

Recently, with improvements in the performance of electronic devices and increases in the volume of multimedia contents, the amount of signal processing in information communication devices has increased. With this increase, the signal transmission rates of interconnections inside and outside electronic devices have increased. This arises the problems of transmission loss and electromagnetic noise interference. A great deal of attention has therefore been paid to optical signal transmission having features of being high-speed and low in noise, and various types of optoelectronic integrated package modules have been proposed.

DETAILED DESCRIPTION

In general, according to one embodiment, there is provided an optoelectronic integrated package module comprising: a silicon interposer including an electrical interconnection and an optical waveguide on a silicon substrate; an optical semiconductor element formed in the silicon interposer, electrically connected to the electrical interconnection, and optically coupled to the optical waveguide; and a semiconductor integrated circuit chip module including a first semiconductor integrated circuit chip including a logic circuit and mounted on a first principal surface and a second semiconductor integrated circuit chip having a second principal surface side mounted on the silicon interposer.

The first and second semiconductor integrated circuit chips are electrically connected to each other via the via interconnections formed inside the second semiconductor integrated circuit chip from the first principal surface. The first or second semiconductor integrated circuit chip receives an electrical signal obtained via the via interconnection by means of the unterminated reception circuit.

Optoelectronic integrated package modules according to embodiments will be described below.

(First Embodiment)

Figure 1A:
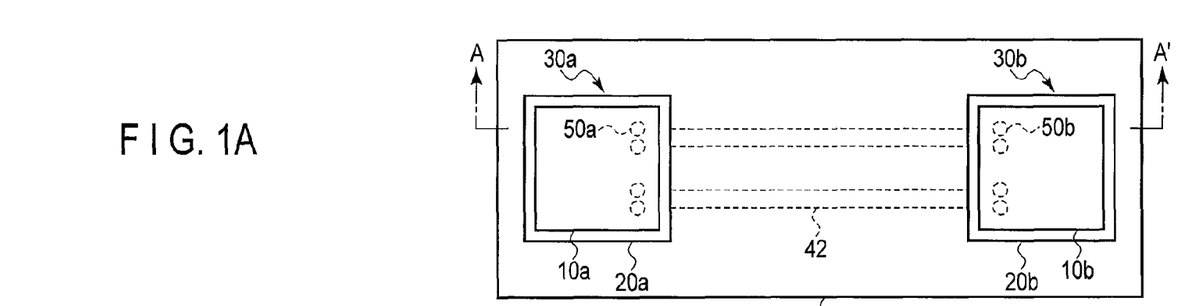
FIG. 1A is a plan view showing the schematic arrangement of an optoelectronic integrated package module according to the first embodiment.
Figure 1B:
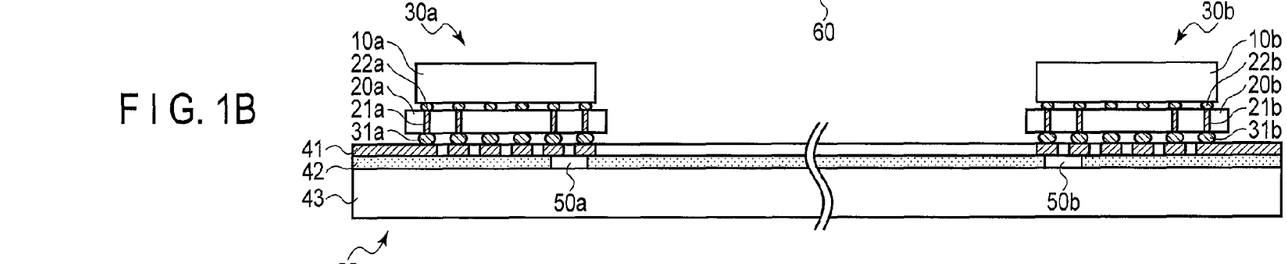
FIG. 1B is a sectional view showing the schematic arrangement of the optoelectronic integrated package module according to the first embodiment.
Figure 1C:
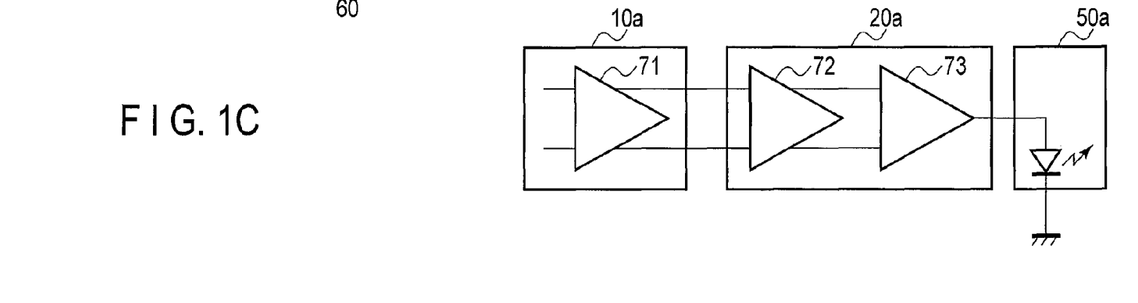
FIG. 1C is a circuit diagram for explaining the schematic arrangement of the optoelectronic integrated package module according to the first embodiment.

FIGS. 1A, to 1C are views for explaining the schematic arrangement of an optoelectronic integrated package module according to the first embodiment. FIG. 1A is a plan view of the optoelectronic integrated package module. FIG. 1B is a sectional view taken along A-A' in FIG. 1A. FIG. 1C is a circuit diagram of the optoelectronic integrated package module.

The optoelectronic integrated package module of this embodiment includes a silicon interposer 60, optical semiconductor elements 50, i.e., 50a and 50b, and semiconductor integrated circuit chip modules 30, i.e., 30a and 30b. The silicon interposer 60 is obtained by forming electrical interconnections 41 and optical waveguides 42 on a silicon substrate 43. The optical semiconductor elements 50a and 50b are formed in the silicon interposer 60. The semiconductor integrated circuit chip modules 30a and 30b respectively include first semiconductor integrated circuit chips 10, i.e., 10a and 10b, and second semiconductor integrated circuit chips 20, i.e., 20a and 20b, mounted on the silicon interposer 60.

The optical semiconductor elements 50 are arranged on the silicon substrate 43 of the silicon interposer 60 so as to be spaced apart from each other. One of the optical semiconductor elements 50 is the light-emitting element 50a, and the other is the light-receiving element 50b. In this case, the optical semiconductor elements 50 are disposed below (on the silicon substrate 43 side) the electrical interconnections 41.

The semiconductor integrated circuit chip modules 30 are respectively provided on the light-emitting element 50a side and the light-receiving element 50b side. That is, on the light-emitting element 50a side, the transmission-side first semiconductor integrated circuit chip 10a and the transmission-side second semiconductor integrated circuit chip 20a are stacked on the silicon interposer 60, thereby forming the first semiconductor integrated circuit chip module 30a. On the light-receiving element 50b side, the reception-side first semiconductor integrated circuit chip (the third semiconductor integrated circuit chip in a strict sense for discrimination from the transmission side) 10b and the reception-side second semiconductor integrated circuit chip (the fourth semiconductor integrated circuit chip in a strict sense for discrimination from the transmission side) 20b are stacked on the silicon interposer 60, thereby forming the second semiconductor integrated circuit chip module 30b.

<Semiconductor Integrated Circuit Chip Module>

The first semiconductor integrated circuit chip 10 is a 10 mm×10 mm system LSI manufactured by a 22 nm generation CMOS process. This chip performs various types of numerical calculations and information processing, device control, and the like. The second semiconductor integrated circuit chip 20 is a transceiver IC having a size of 12 mm×12 mm manufactured by, for example, a 90 nm generation CMOS process. This chip drives the optical semiconductor element 50. More specifically, the second semiconductor integrated circuit chip 20 operates as a driver IC which drives the light-emitting element 50a based on the electrical signal output from the first semiconductor integrated circuit chip 10 and as a receiver IC which amplifies the electrical signal output from the light-receiving element 50b and transmits the signal to the first semiconductor integrated circuit chip 10.

The first and second semiconductor integrated circuit chips 10 and 20 are different chips manufactured by different processes for the following reason. That is, the first semiconductor integrated circuit chip 10 such as a system LSI mainly formed from a logic circuit is required to achieve a reduction in cost, an increase in speed, and a reduction in power consumption. For this reason, the most advanced process is used. In contrast to this, the second semiconductor integrated circuit chip 20 such as a transceiver IC mainly formed from an analog circuit requires a high power supply voltage which cannot be used in the most advanced process. In addition, the advanced process causes the short channel effect and variations in threshold in MOS transistors. For this reason, an old-generation process is used.

The first semiconductor integrated circuit chips 10 are mounted on, for example, Cu micro-bumps 22, i.e., 22a and 22b, each having a diameter of 25 μm, arranged on the second semiconductor integrated circuit chips 20 at a pitch of 50 μm. This forms the semiconductor integrated circuit chip modules 30, i.e., 30a and 30b. The semiconductor integrated circuit chip modules 30 are mounted on, for example, soldering bumps 31, i.e., 31a and 31b, each having a diameter of 50 μm, adhering to the lower surface of the second semiconductor integrated circuit chips 20, at a pitch of 100 μm, on the silicon interposer 60. The semiconductor integrated circuit chip modules 30 are electrically connected to the electrical interconnections 41 on the silicon interposer 60.

Via interconnections 21, i.e., 21a and 21b, are formed in the second semiconductor integrated circuit chip 20. This forms electrical interconnection paths extending from the surfaces (first principal surfaces) on the first semiconductor integrated circuit chip 10 side to the element formation layers in the second semiconductor integrated circuit chips 20 and electrical interconnection paths extending from the surfaces (first principal surfaces) on the first semiconductor integrated circuit chip 10 side to the surfaces (second principal surfaces) on the silicon interposer side. Some electrical input/output terminals of the first semiconductor integrated circuit chips 10 are connected to circuit elements (for example, transistors and resistive elements) in the second semiconductor integrated circuit chips 20. Other electrical input/output terminals of the first semiconductor integrated circuit chips 10 are connected to the electrical interconnections 41 of the silicon interposer 60.

The second semiconductor integrated circuit chip 20 may have a smaller circuit size and a smaller circuit area than the first semiconductor integrated circuit chip 10. However, to mount them as semiconductor integrated circuit chip modules, the second semiconductor integrated circuit chip 20 has a larger external size than the first semiconductor integrated circuit chip 10. This allows to ensure a sufficient circuit formation region in the second semiconductor integrated circuit chip 20. This makes it possible to decouple the power supplied to the first semiconductor integrated circuit chip 10 and the second semiconductor integrated circuit chip 20 by forming an on-chip capacitor in the second semiconductor integrated circuit chip 20. This can reduce power supply noise and improve the signal quality.

Although the second semiconductor integrated circuit chip 20 need not always have a larger size than the first semiconductor integrated circuit chip 10, the second semiconductor integrated circuit chip 20 preferably has a larger size than at least the electrical input/output terminal region formed on the first semiconductor integrated circuit chip 10. This makes it possible to connect all the electrical input/output terminals formed on the first semiconductor integrated circuit chip 10 to the second semiconductor integrated circuit chip 20.

As will be described later, the second semiconductor integrated circuit chips 20 are connected to the optical semiconductor elements 50 via the electrical interconnections 41. In order to shorten the connection distances between them, the second semiconductor integrated circuit chips 20 are preferably inserted between the first semiconductor integrated circuit chips 10 and the silicon interposer 60.

<Silicon Interposer>

The silicon interposer 60 is obtained by forming the electrical interconnections 41, the optical waveguides 42, and the optical semiconductor elements 50a and 50b, on the silicon substrate 43, and has a size of 30 mm×20 mm and a thickness of 400 μm, for example.

The optical waveguide 42 is, for example, an optical waveguide with the cladding being formed from a silicon oxide film and the core being formed from silicon. The core has a sectional area of 300 nm×300 nm. The optical waveguide 42 can confine light in the core having a higher refractive index than the cladding. This allows an optical signal to propagate along the optical waveguide 42.

The optical semiconductor element 50 is an optical semiconductor element having, for example, a ring-like shape with an external diameter of 50 μm and an inner diameter of 30 μm. The light-emitting element 50a converts an electrical signal (current signal) into an optical signal. The light-receiving element 50b converts an optical signal into an electrical signal (current signal). The optical semiconductor element 50 is electrically connected to the electrical interconnection 41 and optically coupled to the optical waveguide 42. It is possible to perform electrical signal input/output operation between the light-emitting element 50a and the light-receiving element 50b by optical signal transmission.

The light-emitting element 50a is more specifically a laser diode element. When a current flows in the light-emitting element 50a, carriers are injected into the active layer to cause induced emission by the recombination of the injected carriers. The light generated by induced emission circulates in a ring-like resonator owing to total reflection, and causes laser oscillation at a specific wavelength determined by the ring circumferential length.

The light-receiving element 50b is, more specifically, a photodiode element. In the light-receiving element 50b, when an optical signal enters the depletion layer of the p-n junction portion, an electrical signal is generated by carrier excitation. In addition, applying a reverse-biased voltage of the diode to the light-receiving element 50b can improve sensitivity and increase the response speed.

More specifically, the optical semiconductor elements 50 are optically coupled to the optical waveguides 42 by distributed coupling (or evanescent coupling). That is, although the optical semiconductor elements 50 are not in direct contact with the optical waveguides 42, an exuding component (evanescent component) from the light-emitting element 50a is coupled to the optical waveguide 42 or an exuding component from the optical waveguide 42 is coupled to the light-receiving element 50b. This implements optical coupling between the optical semiconductor elements 50 and the optical waveguides 42. Such optical coupling obviates the necessity to use a spot size converter which increases or decreases a beam diameter and a deflecting mirror which performs optical path conversion. This can not only simplify the process of forming the silicon interposer 60 but also reduce the size and thickness of the silicon interposer.

As will be described later, the optical semiconductor element 50 is formed as follows. A 1-μm-thick multilayer structure formed on a compound semiconductor substrate is transferred onto the silicon substrate 43 in which the optical waveguides 42 are formed. Subsequently, the resultant structure is patterned upon alignment with the optical waveguides 42, thereby forming the optical semiconductor element 50 on the silicon substrate 43 (in the silicon interposer 60). This makes it possible to accurately align the optical semiconductor element 50 with the optical waveguide 42, thereby achieving high optical coupling efficiency.

Note that the optical semiconductor elements 50 are not optical semiconductor elements which are formed from different chips and mounted on the silicon substrate 43 or the silicon interposer 60. The optical semiconductor elements 50 are formed on the silicon substrate 43 by direct patterning and embedded in the silicon interposer 60. That is, the optical semiconductor elements 50 are arranged below (on the silicon substrate 43 side) the electrical interconnections 41 and completely embedded in an insulator. These elements are not therefore exposed on the surface of the silicon interposer 60. This protects the surfaces of the optical semiconductor elements 50, and can prevent the optical semiconductor elements 50 from being damaged by heating and physical impact when mounting the semiconductor integrated circuit chip modules 30 (described later). In addition, it is possible to implement the above high optical coupling efficiency and compact optical coupling by distributed coupling.

In contrast, the following problems arise if edge emitting semiconductor laser chips, vertical cavity surface emitting laser (VCSEL) chips, or surface incident photodiode chips are used as the optical semiconductor elements 50, and are mounted on the silicon interposer 60 by die bonding. That is, a mounting position shift (for example, 10 μm) larger than the size of the optical waveguide 42 (the sectional size is 300 nm×300 nm in this case) may occur to lead to a considerable deterioration in optical coupling efficiency. In addition, to implement optical coupling to the optical waveguide 42, it is necessary to form a spot size converter which increases or decreases a beam diameter and a 45° mirror for optical path conversion at an optical coupling portion with the optical waveguide. This complicates the process of forming the silicon interposer 60 and also increases the size or thickness of the silicon interposer 60.

The electrical interconnection 41 is formed from, for example, a 1-μm-thick electrical interconnection having a Ti/Pt/Au three-layer structure. It is preferable to form, for example, a photosensitive polyimide film on the electrical interconnections 41 to protect and insulate the surfaces and form electrical connection terminals.

<Optoelectronic Integrated Package Module>

As described above, the semiconductor integrated circuit chip modules 30 are mounted on the soldering bumps 31 adhering to the lower surfaces of the second semiconductor integrated circuit chips 20 on the silicon interposer 60. Some electrical input/output terminals of the second semiconductor integrated circuit chips 20 are electrically connected to the optical semiconductor elements 50 via the electrical interconnections 41 of the silicon interposer 60. Therefore, the second semiconductor integrated circuit chip 20a drives the light-emitting element 50a based on the electrical signal output from the first semiconductor integrated circuit chip 10a. The second semiconductor integrated circuit chip 20b amplifies the electrical signal output from the light-receiving element 50b, and transmits the signal to the first semiconductor integrated circuit chip 10b. This can implement high-speed, low-noise optical signal transmission from the first semiconductor integrated circuit chip 10a to the first semiconductor integrated circuit chip 10b. Assume that the optical signal transmission rate is, for example, 10 Gbps or more.

Both the semiconductor integrated circuit chip modules 30 and the silicon interposer 60 use silicon substrates, and hence have almost the same thermal expansion characteristics. This makes it possible to prevent the semiconductor integrated circuit chip modules from being broken due to thermal strain when circuit operation raises the chip temperature and to suppress deterioration in reliability.

The semiconductor integrated circuit chip modules 30 are mounted on the silicon interposer 60 so as to overlap the optical semiconductor elements 50 when viewed from above. This can minimize the area necessary for the transmission or reception of optical signals. That is, it is possible to reduce the cost of an optoelectronic integrated package module.

In the optoelectronic integrated package module of this embodiment, the optical semiconductor elements 50 are formed in alignment with the optical waveguides 42 of the silicon interposer 60. This makes it possible to complete the optoelectronic integrated package module by only mounting the semiconductor integrated circuit chip modules 30 on the silicon interposer 60. This therefore facilitates a mounting process. In addition, temperature changes do not cause the problems of the optical axis shift between the optical semiconductor elements 50 and the optical waveguides 42 and the like. Furthermore, this module has excellent reliability.

Figure 2:
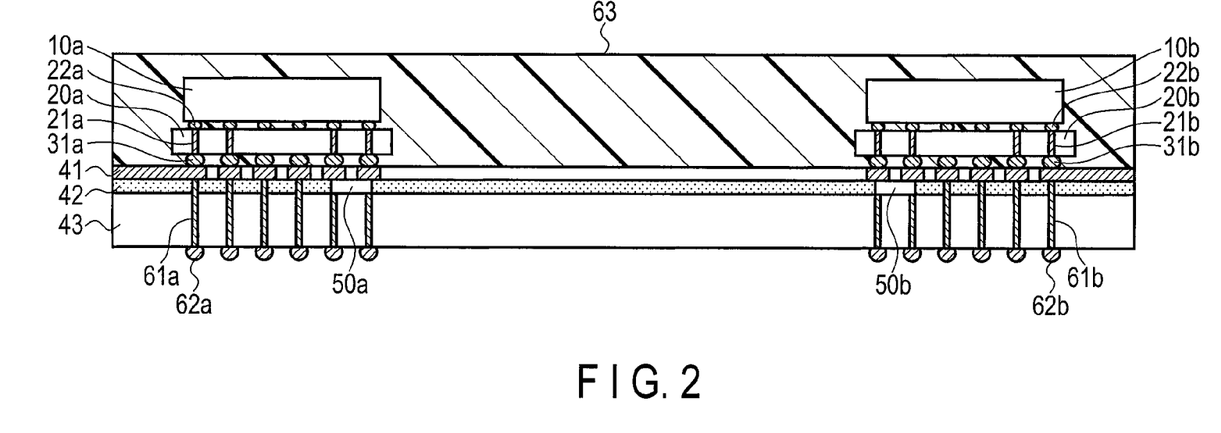
FIG. 2 is a sectional view showing a state in which an optoelectronic integrated package module in FIG. 1A is coated with a mold resin.

As shown in FIG. 2, the optoelectronic integrated package module is preferably packaged in advance. That is, it is preferable to form through silicon electrodes (through-silicon vias [TSVs]) 61, i.e., 61a and 61b, and soldering bumps 62, i.e., 62a and 62b, which are connected to the electrical interconnections 41, on the silicon interposer 60 and protect their surfaces with a mold resin 63 in advance. This makes it possible to mount the optoelectronic integrated package module of this embodiment on an external substrate. Consequently, it is possible to improve the operation performance of system equipment such as a server by embedding the optoelectronic integrated package module of this embodiment in the system equipment.

<Comparison Between Optoelectronic Integrated Package Modules Examined Above>

Figure 11A:
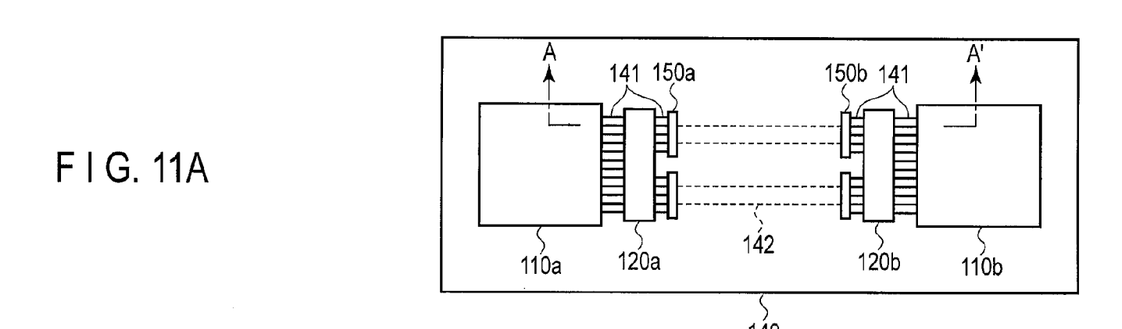
FIG. 11A is a plan view showing an example of an optoelectronic integrated package module as a comparative example.
Figure 11B:
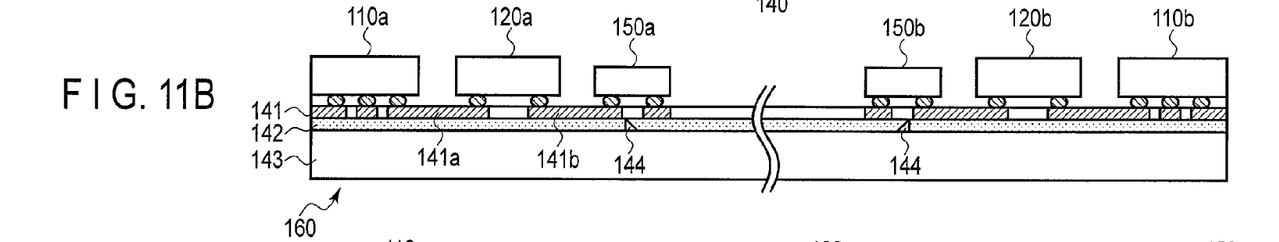
FIG. 11B is a sectional view showing the example of the optoelectronic integrated package module as the comparative example.
Figure 11C:
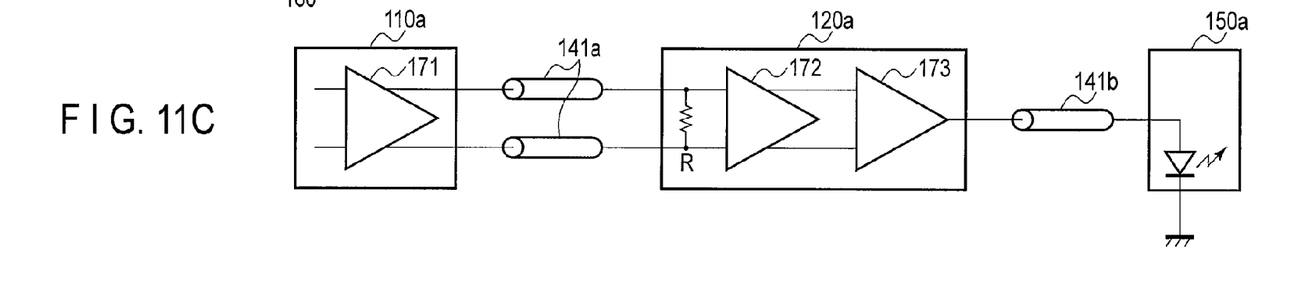
FIG. 11C is a circuit diagram showing the example of the optoelectronic integrated package module as the comparative example.

For a description of the features of the optoelectronic integrated package module of this embodiment, a general optoelectronic integrated package module will be briefly described below. FIGS. 11A to 11C are views for explaining the schematic arrangement of an optoelectronic integrated package module as a comparative example. FIG. 11A is a plan view. FIG. 11B is a sectional view taken along A-A' in FIG. 11A. FIG. 11C is a schematic circuit diagram on the transmission side.

As shown in FIGS. 11A and 11B, the optoelectronic integrated package module as a comparative example has a silicon interposer obtained by forming electrical interconnections 141 and optical waveguides 142 on a silicon substrate 143. First semiconductor integrated circuit chips 110, i.e., 110a and 110b, second semiconductor integrated circuit chips 120, i.e., 120a and 120b, and optical semiconductor elements 150, i.e., 150a and 150b, are surface-mounted on a silicon interposer 160.

On the two ends of the optical waveguide 142, 45° deflecting mirrors 144 are formed. The optical semiconductor elements 150 are electrically connected to the electrical interconnections 141 and optically coupled to the optical waveguides 142. This can implement optical signal transmission of electrical signal inputs/outputs between the light-emitting element 150a and the light-receiving element 150b. For this reason, the second semiconductor integrated circuit chip 120a drives the light-emitting element 150a based on the electrical signal output from the first semiconductor integrated circuit chip 110a. In addition, the second semiconductor integrated circuit chip 120b amplifies the electrical signal output from the light-receiving element 150b and transmits the signal to the first semiconductor integrated circuit chip 110b. This can implement signal transmission from the first semiconductor integrated circuit chip 110a to the first semiconductor integrated circuit chip 110b.

In the optoelectronic integrated package module as the comparative example, as described above, the first semiconductor integrated circuit chips 110 (for example, 10 mm×10 mm), the second semiconductor integrated circuit chips 120 (for example, 3 mm×9 mm), and the optical semiconductor elements 150 (for example, 0.5 mm×3 mm) are two-dimensionally mounted on the silicon interposer 160. Therefore, the size of the optoelectronic integrated package module becomes larger by the second semiconductor integrated circuit chips 120, the optical semiconductor elements 150, and the mounting margins for them than that of the module formed by three-dimensionally mounting the above chips and elements. This has led to an increase in cost. In addition, transmission lines (electrical interconnections 141a) which connect the first semiconductor integrated circuit chips 110 to the second semiconductor integrated circuit chips 120 and transmission lines (electrical interconnections 141b) which connect the second semiconductor integrated circuit chips 120 to the light-emitting elements 150a have lengths on the order of millimeters. It is therefore necessary to consider attenuation in the transmission lines and reflection at the reception ends with regard to transmission signals.

Reflection at a reception end, in particular, increases when the characteristic impedance of a transmission line differs from the resistance of the reception end. For this reason, as shown in FIG. 11C, when a transmission circuit 171 of the first semiconductor integrated circuit chip 110a transmits a signal to the second semiconductor integrated circuit chip 120a, it is necessary to receive the signal via a reception circuit 172 terminated by a resistor (R in FIG. 11C) having a resistance equal to the characteristic impedance of electrical interconnections 141a. This makes it necessary to supply a current (4 mA if a terminal resistor R is 100Ω and the reception voltage of the reception circuit 172 is 400 mV) large enough to generate the reception voltage of the reception circuit 172 across the terminal resistor R. This has led to an increase in power consumption.

In addition, when the transmission circuit 171 of the first semiconductor integrated circuit chip 110a transmits a signal to the second semiconductor integrated circuit chip 120a, the transmission signal attenuates in electrical interconnection 141a depending on the frequency. Furthermore, when a driving circuit 173 of the second semiconductor integrated circuit chip 120a drives the light-emitting element 150a, the transmission signal attenuates in electrical interconnection 141b depending on the frequency. This has led to the problem of deterioration in signal quality such as an increase in jitter due to inter-symbol interference (ISI).

In the optoelectronic integrated package module of this embodiment, the first semiconductor integrated circuit chips 10 are mounted on the second semiconductor integrated circuit chips 20, and are electrically connected to them via the Cu micro-bumps 22 and the via interconnections 21. If, for example, the Cu microbump 22 has a height of 10 μm and the via interconnection 21 has a height of 50 μm, the length of the electrical interconnection connecting the first semiconductor integrated circuit chip 10 to the second semiconductor integrated circuit chip 20 is 60 μm. This is about 0.004 times, for example, the wavelength (15 mm) of a transmission signal having a frequency of 10 GHz in a dielectric element with a specific dielectric constant of 4. That is, since the length of the transmission line is sufficiently smaller than the wavelength of a transmission signal, the influences of attenuation in the transmission lines and reflection at the reception ends are small.

For this reason, as shown in FIG. 1C, when a transmission circuit 71 of a first semiconductor integrated circuit chip 10a transmits a signal to a second semiconductor integrated circuit chip 20a, an unterminated reception circuit 72 can receive the signal. A driving circuit 73 then can drive a light-emitting element 50a. This can reduce power consumption because there is no need to supply a current large enough to make a terminal resistor generate the reception voltage of the reception circuit 72. In order to regard the influences of attenuation in a transmission line and reflection at the reception end small, the length of an electrical interconnection is preferably 1/10 or less of the wavelength of a transmission signal.

Figure 3:
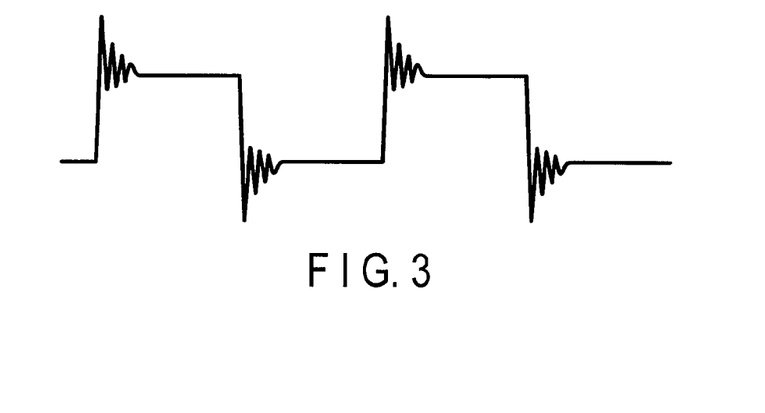
FIG. 3 is a waveform chart showing the occurrence of ringing at rising and falling of an electrical signal.

In this case as well, as shown in FIG. 3, ringing occurs at portions where transitions such as rising and falling of an electrical signal occur. This is because the portions where the transitions occur include spectrum components having higher frequencies than the transmission signal, and the components are reflected. Such reflection has the problem of electromagnetic interference (EMI), i.e., large electromagnetic noise is emitted and enters other devices and elements to cause an operation error. That is, an optoelectronic integrated package module using only an unterminated reception circuit for the reduction of power consumption has low practicability.

For this reason, this embodiment uses the silicon interposer 60, in which the optical semiconductor elements 50 are formed, to place the optical semiconductor elements 50 near the semiconductor integrated circuit chip modules 30. This shortens the lengths of the electrical interconnections 41 connecting the semiconductor integrated circuit chip modules 30 to the optical semiconductor elements 50, and hence can reduce the intensity of electromagnetic noise emitted from the electrical interconnections 41. This can implement a low power consumption optoelectronic integrated package module having high practicability. Although the shorter the length of the electrical interconnection 41, the better, it is preferable to set the length to 1/10 or less of the wavelength of a transmission signal. Obviously, with regard to the electrical interconnections 41 connecting the semiconductor integrated circuit chip modules 30 to the optical semiconductor elements 50, it is possible to reduce the influences of attenuation in the transmission lines and reflection at the reception ends.

Note that as shown in FIG. 10, the transmission circuit 71 of the first semiconductor integrated circuit chip 10a is DC-coupled to the reception circuit 72 of the second semiconductor integrated circuit chip 20a. For this reason, the power supply voltage of the transmission circuit 71 is preferably lower than that of the reception circuit 72. This can prevent an element from being destroyed by a DC overcurrent applied to the input transistor of the reception circuit 72 of the second semiconductor integrated circuit chip 20a, and improve reliability.

<Effects>

As described above, the optoelectronic integrated package module of this embodiment allows high-speed, low-noise optical signal transmission between the first semiconductor integrated circuit chip 10a on the transmission side and the first semiconductor integrated circuit chip 10b on the reception side. Since the semiconductor integrated circuit chip modules 30 are mounted on the silicon interposer 60 and have almost the same thermal expansion characteristics, it is possible to suppress deterioration in reliability. Likewise, the optoelectronic integrated package module can be implemented by the simple process of only mounting the semiconductor integrated circuit chip modules 30 on the silicon interposer 60, and is free from the problems of the optical axis shift between the optical semiconductor elements 50 and the optical waveguides 42 and the like. Therefore, this module has excellent reliability. The semiconductor integrated circuit chip modules 30 are mounted on the silicon interposer 60 so as to overlap the optical semiconductor elements 50 when viewed from above. This can minimize the area necessary for the transmission or reception of optical signals. It is therefore possible to achieve a reduction in the cost of an optoelectronic integrated package module.

In addition, in the optoelectronic integrated package module of this embodiment, since the first semiconductor integrated circuit chips 10 and the second semiconductor integrated circuit chips 20 are stacked on each other, and the second semiconductor integrated circuit chips 20 receive signals via the unterminated reception circuits 72, it is possible to reduce power consumption. Furthermore, placing the optical semiconductor elements 50 near the semiconductor integrated circuit chip modules 30 can reduce the influence of electromagnetic noise emission due to the occurrence of ringing by the unterminated reception circuits 72. This makes it possible to implement an optoelectronic integrated package module having high practicability.

<Manufacturing Method>

A method of manufacturing the optoelectronic integrated package module of this embodiment will be described below.

Figure 4A:
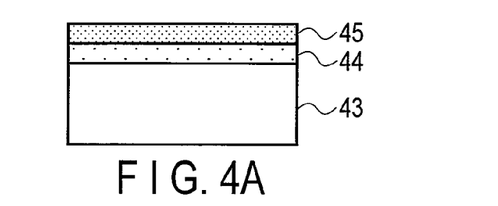
FIGS. 4A to 4C are sectional views of steps for explaining the process of forming an optical waveguide.
Figure 4B:
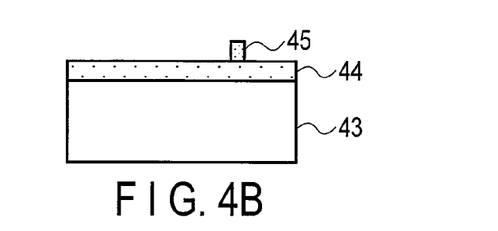
Figure 4C:
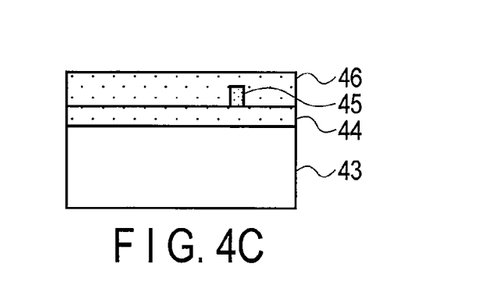

First of all, the optical waveguide 42 is formed in the silicon interposer 60. More specifically, as shown in FIG. 4A, a silicon oxide film 44 and a silicon layer 45 are sequentially formed on the silicon substrate 43 by chemical vapor deposition (CVD). As shown in FIG. 4B, the silicon layer 45 is then patterned. As shown in FIG. 4C, a silicon oxide film 46 is formed by CVD. Lastly, the surface of the resultant structure is planarized by chemical mechanical polishing (CMP).

Note that a silicon-on-insulator (SOI) substrate having an $SiO_2$ film inserted between a silicon substrate and a surface silicon film may be used as the silicon substrate 43 from the first. In this case, since a single-crystal Si film can be used as the surface silicon film, it is possible to form an optical waveguide with a small optical loss. In contrast to this, if a silicon layer is formed by CVD as described above, the surface silicon film is a poly-Si film or amorphous Si film. Consequently, the optical loss of the optical waveguide increases as compared with the use of a single-crystal Si film. Note that as a material for the core of the optical waveguide 42, it is possible to use, for example, single-crystal Si, microcrystalline Si, poly-Si, amorphous Si, SiN, SiON, or a polymer-based material.

The multilayer structure formed on the compound semiconductor substrate is transferred onto the silicon substrate 43 and patterned to form the ring-like optical semiconductor elements 50 on the silicon substrate.

Figure 5A:
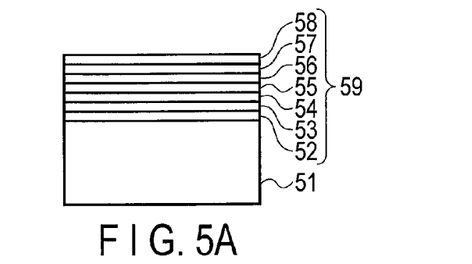
FIGS. 5A to 5F are sectional views of steps for explaining the process of forming an optical semiconductor element.

More specifically, as shown in FIG. 5A, after an n-GaAs buffer layer and an n-AlGaAs etching stop layer (neither of which is shown) are formed on an n-GaAs substrate 51 by metal organic chemical vapor deposition (MOCVD), a multilayer structure 59 is formed on the resultant structure. The multilayer structure 59 includes an n-GaAs contact layer 52, an n-AlGaAs cladding layer 53, an n-GaAs light confining layer 54, a GaAs active layer 55, a p-GaAs light confining layer 56, a p-AlGaAs cladding layer 57, and a p-GaAs contact layer 58.

Figure 5B:
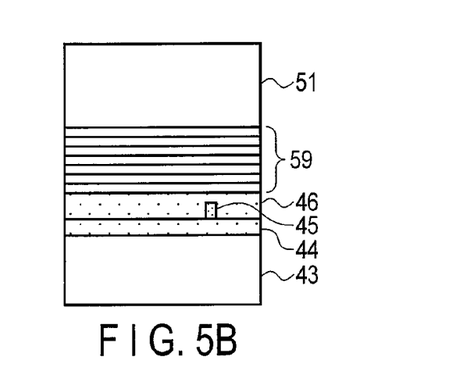
Figure 5C:
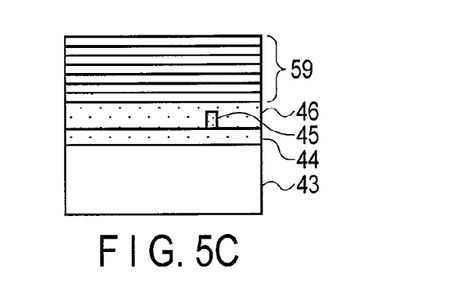

As shown in FIG. 5B, the surface (on the multilayer structure 59 side) of this compound semiconductor substrate and the surface of the silicon substrate (which is located on the side where the optical waveguide 42 is formed) described above are activated by an Ar plasma process. These substrates are made to face each other and come into contact with each other and are joined by thermocompressing bonding in an inert gas. As shown in FIG. 5C, the n-GaAs substrate 51, the n-GaAs buffer layer, and the n-AlGaAs etching stop layer are then removed by wet etching to expose the n-GaAs contact layer 52.

Figure 5D:
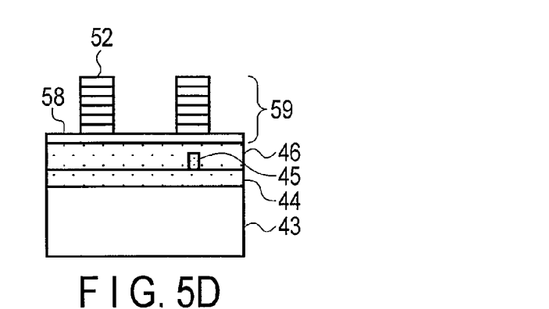
Figure 5E:
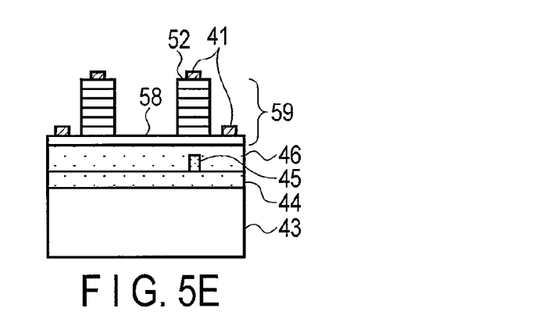
Figure 6:
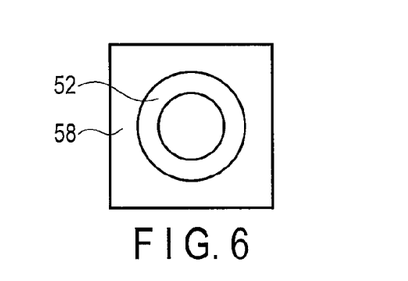
FIG. 6 is a plan view showing a state in which a multilayer structure is patterned into a ring shape in the step of FIG. 5D.

As shown in FIG. 5D, the multilayer structure 59 is patterned in the form of a ring until the p-GaAs contact layer 58 is exposed. FIG. 6 is a plan view of the resultant structure. As shown in FIG. 5E, the electrical interconnections (electrodes) 41 are formed on the n-GaAs contact layer 52 and the p-GaAs contact layer 58.

The optical semiconductor element 50 formed in this manner can function as both a light-emitting element and a light-receiving element. This indicates that the light-emitting element 50a and the light-receiving element 50b can be simultaneously formed. That is, making the light-emitting element 50a and the light-receiving element 50b have the same structure allows to form them by one crystal growth process. In addition, the shapes into which the light-emitting element 50a and the light-receiving element 50b are patterned may be changed as needed to be suitable for the respective operations.

Figure 5F:
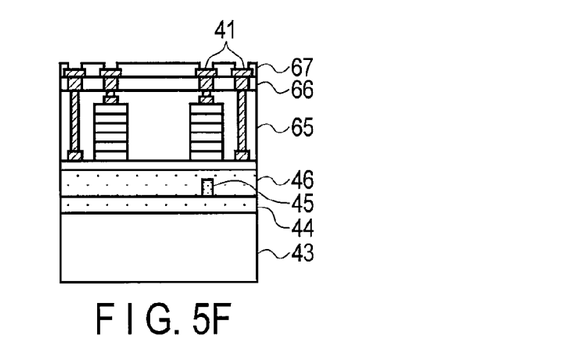

As is obvious from FIG. 5E, the n-GaAs contact layer 52 differs in surface height from the p-GaAs contact layer 58. As shown in FIG. 5F, a silicon oxide film 65 is formed by CVD, and its surface is planarized by CMP. The surface is then coated with photosensitive polyimide 66, which is then patterned. Thereafter, electrical interconnections are formed by patterning. This preferably extracts the electrical interconnections 41 to the same height, which are connected to the n-GaAs contact layer 52 and the p-GaAs contact layer 58, and forms the electrical interconnections 41 on the silicon interposer 60. In addition, a photosensitive polyimide film 67 is preferably formed on the electrical interconnections 41 again and patterned to protect and insulate the surface of the silicon interposer 60 and form electrical connection terminals.

The first semiconductor integrated circuit chips 10 and the second semiconductor integrated circuit chips 20 are formed by a CMOS process. The via interconnections 21 of the second semiconductor integrated circuit chip 20 are formed in the manner shown in FIGS. 7A to 7F.

Figure 7A:
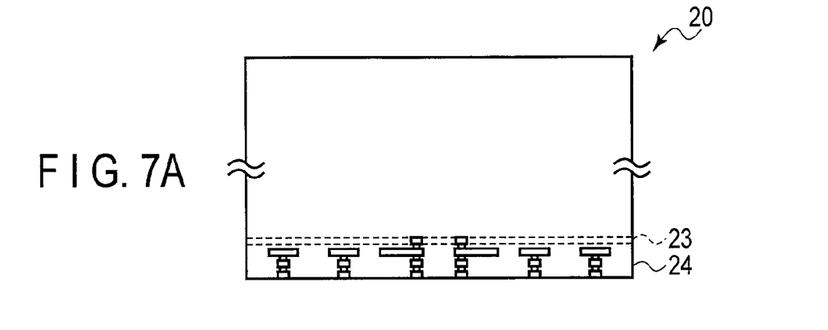
FIGS. 7A to 7F are sectional views of steps for explaining the process of forming interconnection vias.
Figure 7B:
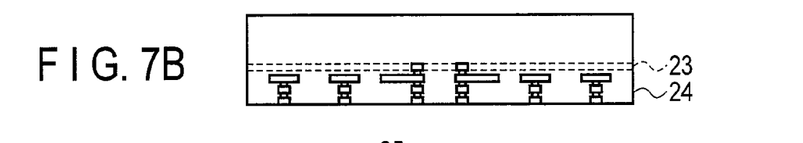
Figure 7C:
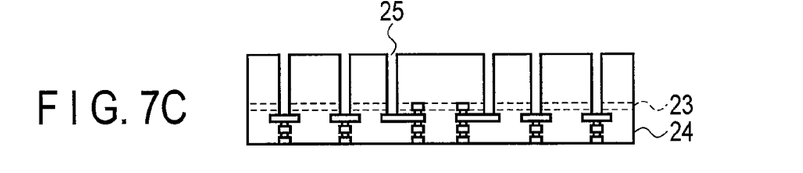

The lower surface of a wafer before the second semiconductor integrated circuit chip 20 like that shown in FIG. 7A is cut is thinned by grinding to the degree that the distance from an element formation layer 23 to the lower surface becomes about 50 µm, as shown in FIG. 7B. Thereafter, as shown in FIG. 7C, 10-µm-diameter via holes 25 extending from the lower surface to a multi-interconnection layer 24 are formed by etching.

Figure 7D:
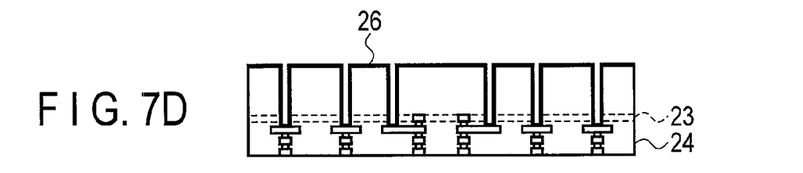
Figure 7E:
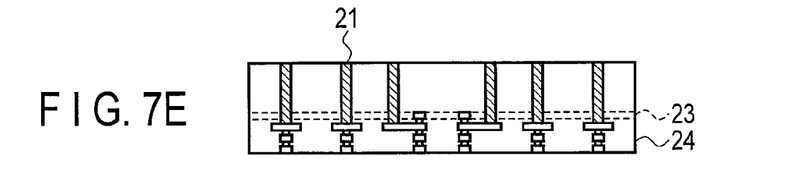

As shown in FIG. 7D, after an SiON film as an insulating film and Ti/TiN as a barrier metal are sequentially formed on the inner wall of each via hole 25, a Cu seed metal 26 is formed by sputtering. The via hole 25 is then filled with Cu by electrolytic plating, and the surface of the hole is planarized by CMP, thereby forming the via interconnection 21, as shown in FIG. 7E.

Figure 7F:
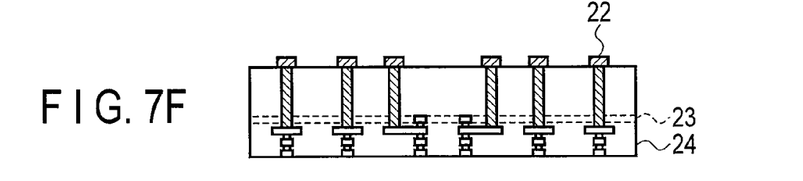

As shown in FIG. 7F, the Cu micro-bumps 22 are formed by forming a Cu seed metal again, applying and patterning a resist, electrolytically plating the surface, and removing the resist and the Cu seed metal. Finally, dicing is performed to complete the second semiconductor integrated circuit chip 20 in and on which the via interconnections 21 and the Cu micro-bumps 22 are formed.

The semiconductor integrated circuit chip modules 30 are formed by stacking the first semiconductor integrated circuit chips 10 on the second semiconductor integrated circuit chips 20. In this case, the pad electrode surfaces of the first semiconductor integrated circuit chips 10 are plated with Ni/Au, and the surfaces of the Cu micro-bumps 22 of the second semiconductor integrated circuit chips 20 are plated with Sn—Ag. This can solder the pad electrodes of the first semiconductor integrated circuit chips 10 to the Cu micro-bumps 22 of the second semiconductor integrated circuit chips 20 by mounting the pad electrodes on the Cu micro-bumps 22 and performing thermocompressing bonding. Note that a resin material such as non-conductive paste (NCP) may be used at the time of thermocompressing bonding.

Lastly, the soldering bumps 31 are formed on the second principal surface side of the second semiconductor integrated circuit chips 20, and the resultant structure is mounted on the silicon interposer 60 by reflow to complete the optoelectronic integrated package module. In a reflow process, for example, an underfill resin or the like is preferably used to reinforce the junction.

As described above, according to this embodiment, the semiconductor integrated circuit chip modules 30 on which the first semiconductor integrated circuit chips 10 and the second semiconductor integrated circuit chips 20 are mounted are stacked on the silicon interposer 60 incorporating the optical semiconductor elements 50, and the first semiconductor integrated circuit chips 10 and the second semiconductor integrated circuit chips 20 are connected via unterminated interconnections. This makes it possible to implement an optoelectronic integrated package module which can achieve reductions in power consumption and noise.

(Second Embodiment)

Figure 8A:
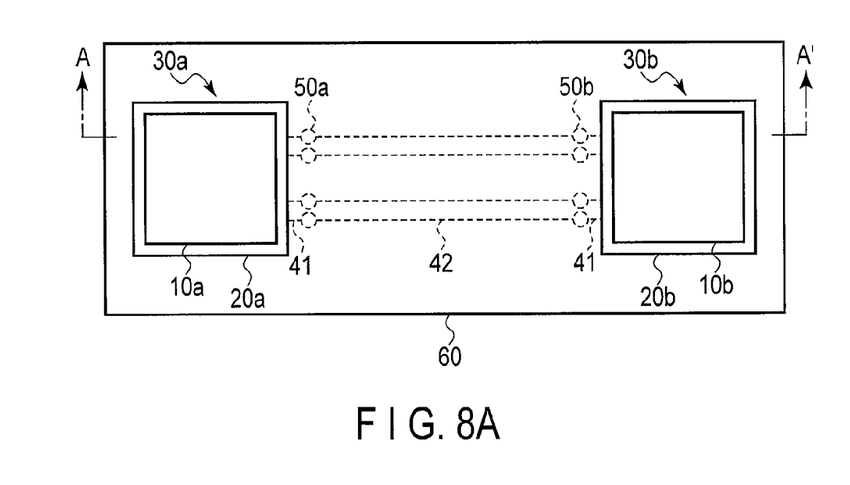
FIG. 8A is a plan view showing the schematic arrangement of an optoelectronic integrated package module according to the second embodiment.
Figure 8B:
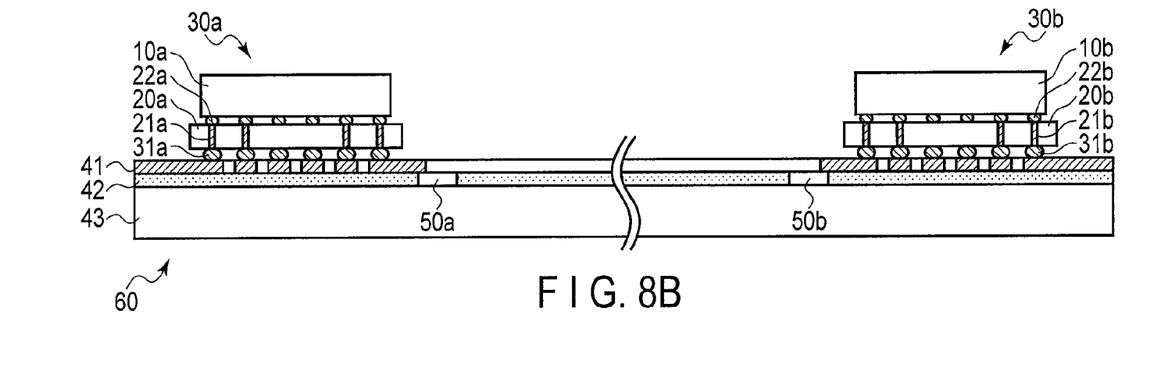
FIG. 8B is a sectional view showing the schematic arrangement of the optoelectronic integrated package module according to the second embodiment.

FIGS. 8A and 8B are views for explaining the schematic arrangement of an optoelectronic integrated package module according to the second embodiment. FIG. 8A is a plan view. FIG. 8B is a sectional view taken along A-A' in FIG. 8A. Note that the same reference numbers as in FIGS. 1A and 1B denote the same parts in FIGS. 8A and 8B, and a detailed description of them will be omitted.

In the optoelectronic integrated package module shown in FIGS. 1A and 1B, the optical semiconductor elements 50 are arranged so as to overlap semiconductor integrated circuit chip modules 30 when viewed from above. In contrast to this, in this embodiment, as shown in FIGS. 8A and 8B, optical semiconductor elements 50 are arranged outside semiconductor integrated circuit chip modules 30 when viewed from above. This facilitates heat dissipation from the optical semiconductor elements 50. In this case, in order to sufficiently reduce the influences of attenuation in transmission lines and reflection at the reception ends, the length of electrical interconnections is preferably 1/10 or less of the wavelength of a transmission signal.

This arrangement can reduce the influence of heat generation from the semiconductor integrated circuit chip modules 30 and improve the temperature characteristics of the optical semiconductor elements 50 as well as obtaining the same effects as those of the first embodiment described above.

(Third Embodiment)

Figure 9:
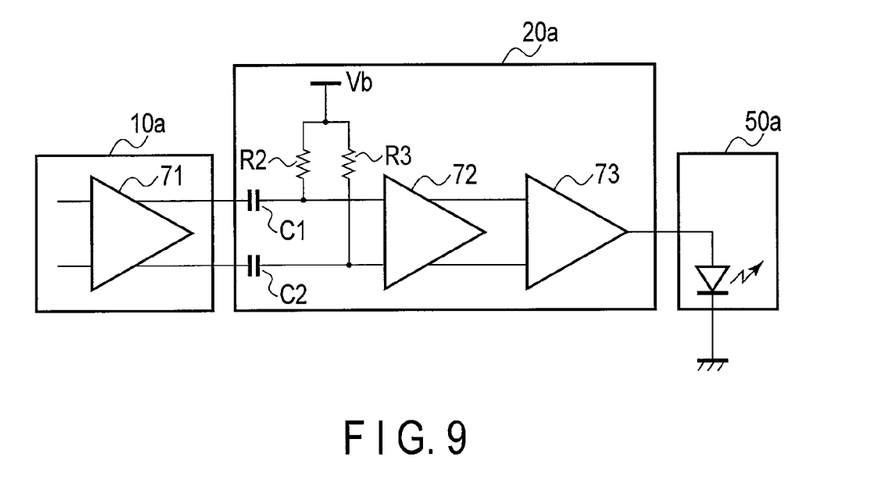
FIG. 9 is a circuit diagram showing an arrangement of an optoelectronic integrated package module which corresponds to the transmission side according to the third embodiment.

FIG. 9 is a circuit diagram for explaining an optoelectronic integrated package module according to the third embodiment, showing an example of capacitive coupling between the transmission circuit of a first semiconductor integrated circuit chip and the reception circuit of a second semiconductor integrated circuit chip.

In the optoelectronic integrated package module shown in FIG. 1C, the transmission circuit 71 of the first semiconductor integrated circuit chip 10a is DC-coupled to the reception circuit 72 of the second semiconductor integrated circuit chip 20a. In contrast to this, in this embodiment, as shown in FIG. 9, they are capacitively coupled to each other by means of capacitors C1 and C2. With this arrangement, when the power supply voltage of a transmission circuit 71 of a first semiconductor integrated circuit chip 10a is higher than that of a reception circuit 72 of a second semiconductor integrated circuit chip 20a, it is possible to prevent an element from being destroyed by a DC overvoltage applied to the input transistor of the reception circuit 72 of the second semiconductor integrated circuit chip 20a. This can improve reliability.

Note that when the transmission circuit 71 of the first semiconductor integrated circuit chip 10a is capacitively coupled to the reception circuit 72 of the second semiconductor integrated circuit chip 20a, it is preferable to apply a predetermined input DC level (Vb) to the reception circuit 72 by means of resistors R2 and R3, as shown in FIG. 9. For this reason, a resistor having a resistance of R2+R3 is inserted between the differential inputs. However, setting the sum of resistances R2 and R3 to, for example, the order of kilo-ohms can set the current flowing in resistors R2 and R3 to the order of microamperes. It is therefore still possible to obtain the effect of reducing power consumption by reception at an unterminated circuit.

(Fourth Embodiment)

In the first embodiment, as shown in FIGS. 5A to 5F, the optical semiconductor element 50 is formed on the silicon substrate 43 by transferring the multilayer structure 59 formed on the n-GaAs substrate 51 onto the silicon substrate 43 in which the optical waveguides 42 are formed and patterning the resultant structure. In contrast to this, as shown in FIGS. 10A to 10F, this embodiment can directly form an optical semiconductor element 50 on a silicon substrate 43.

Figure 10A:
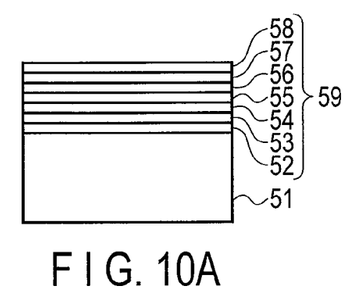
FIGS. 10A to 10F are sectional views of steps for explaining the process of forming an optical semiconductor element of an optoelectronic integrated package module according to the fourth embodiment.
Figure 10B:
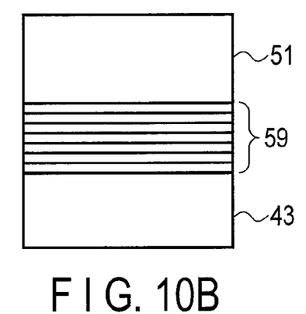
Figure 10C:
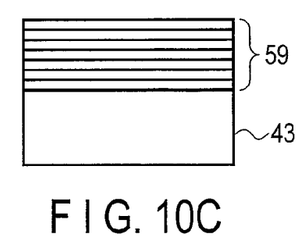

That is, as shown in FIG. 10A, a multilayer structure 59 is formed on an n-GaAs substrate 51. As shown in FIG. 10B, the surface (on the multilayer structure 59 side) of this compound semiconductor substrate and the surface of a silicon substrate 43 are activated by an Ar plasma process. These substrates are made to face each other and come into contact with each other and are joined by thermocompressing bonding in an inert gas. As shown in FIG. 10C, the n-GaAs substrate 51, an n-GaAs buffer layer, and an n-AlGaAs etching stop layer are then removed by wet etching to expose an n-GaAs contact layer 52.

Figure 10D:
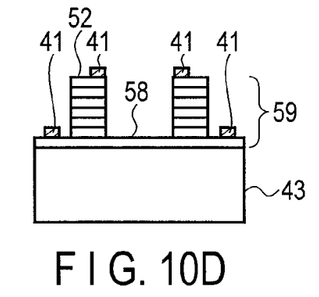
Figure 10E:
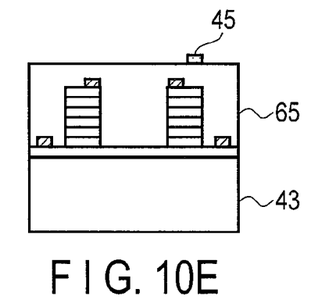

As shown in FIG. 10D, the multilayer structure 59 is patterned in the form of a ring until a p-GaAs contact layer 58 is exposed. In addition, electrical interconnections (electrodes) 41 are formed on the n-GaAs contact layer 52 and the p-GaAs contact layer 58. Thereafter, as shown in FIG. 10E, a silicon oxide film 65 is formed by CVD until the optical semiconductor element 50 is embedded, and the surface of the resultant structure is planarized by CMP. A core 45 is formed by forming and patterning a silicon layer (poly-Si layer).

Figure 10F:
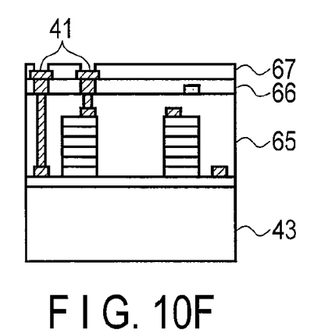

Finally, as shown in FIG. 10F, photosensitive polyimide 66 is applied to the silicon oxide film 65 and patterned to form the electrical interconnections 41 connected to the n-GaAs contact layer 52 and the p-GaAs contact layer 58. Thereafter, a photosensitive polyimide film 67 is formed again on the electrical interconnections 41 and patterned to protect and insulate the surface of a silicon interposer 60 and forms electrical connection terminals.

The optical semiconductor element 50 formed in this manner is formed in direct contact with the silicon substrate 43 having better thermal conductivity than a silicon oxide film. This element allows easy heat dissipation and has excellent temperature characteristics as compared with an optical semiconductor element formed on a silicon oxide film.
(Modification)

Note that the present invention is not limited to the respective embodiments described above.

Various types of semiconductor integrated circuit chips such as a CPU can be applied to the first semiconductor integrated circuit chip. For example, this chip may be a graphics processing unit (GPU), microcontroller, field-programmable gate array (FPGA), or controller (sensor controller or memory/storage controller) for controlling various devices.

Likewise, the second semiconductor integrated circuit chip may be either a driver IC or receiver IC instead of a transceiver IC. In addition, this chip may include various types of different circuits such as a serializing circuit which converts a parallel electrical signal into a serial electrical signal and a de-serializing circuit which converts a serial electrical signal into a parallel electrical signal, in addition to a driver circuit and a receiver circuit. Mounting a serializing circuit on the second semiconductor integrated circuit chip on the transmission side and a de-serializing circuit on the second semiconductor integrated circuit chip on the reception side can transmit a plurality of electrical inputs and outputs upon converting them into a small number of optical signals.

In addition, the semiconductor integrated circuit chip module 30 may be a semiconductor integrated circuit chip module formed by stacking not only the first and second semiconductor integrated circuit chips but also other chips and modules.

In the optoelectronic integrated package module shown in FIGS. 1A, to 1C, the light-emitting element 50a is formed on the semiconductor integrated circuit chip modules 30a side, and the light-receiving element 50b is formed on the semiconductor integrated circuit chip modules 30b side. However, the light-receiving element 50b may be formed on the semiconductor integrated circuit chip module 30a side, and the light-emitting element 50a may be formed on the semiconductor integrated circuit chip module 30b side. Alternatively, both the light-emitting element 50a and the light-receiving element 50b may be formed on both the semiconductor integrated circuit chip module 30a side and the semiconductor integrated circuit chip module 30b side. This makes it possible to transmit signals from the first semiconductor integrated circuit chip 10b to the first semiconductor integrated circuit chip 10a or bidirectionally transmit signals between the first semiconductor integrated circuit chips 10a and 10b.

In the optoelectronic integrated package module shown in FIGS. 1A to 1C, a transmission signal from the transmission circuit 71 of the first semiconductor integrated circuit chip 10a to the reception circuit 72 of the second semiconductor integrated circuit chip 20a is a differential signal. However, the transmission signal is not limited to this and may be a single-end signal.

The embodiments have exemplified the case in which a GaAs-based material is used as a compound semiconductor material. For example, an InP-based material may be used. The wavelength to be used can be changed as needed in accordance with the material. In addition, the embodiments have exemplified the case in which the multilayer structure formed on the compound semiconductor substrate is transferred onto the silicon substrate. However, the embodiments are not limited to this. The optical semiconductor element 50 may be directly formed on the silicon substrate without using any compound semiconductor substrate. In addition, in the embodiments, the optical semiconductor element 50 has a ring-like shape. However, the optical semiconductor element 50 may have other shapes such as a disk-like shape and an elliptic shape.

The embodiments have exemplified the via last process of forming the via interconnections 21 after the formation of the element formation layer 23 and the multi-interconnection layer 24 in the second semiconductor integrated circuit chip 20. However, the embodiments are not limited to this. The embodiments may form the via interconnections 21 by a via middle process of forming via interconnections when the formation of the element formation layer 23 is complete or a via first process of forming via interconnections before the formation of the element formation layer 23.

In the second semiconductor integrated circuit chip 20, the electrical interconnection paths may extend from the first principal surface to the second principal surface in any of the following manners. As exemplified in the embodiments, the electrical interconnection paths may be formed from the multi-interconnection layer formed on one of the principal surface sides of the second semiconductor integrated circuit chip 20 and the via interconnections 21 formed to extend from the other principal surface to the multi-interconnection layer. In addition, the electrical interconnection paths may be formed from the via interconnections 21 formed to extend from the first principal surface to the second principal surface. Furthermore, the electrical interconnection paths may be formed from first via interconnections 21 formed from one principal surface of the second semiconductor integrated circuit chip 20 and second via interconnections 21 formed to extend from the other principal surface to the first via interconnections.

The embodiments have exemplified the case in which the Cu micro-bumps are formed on the first principal surface side of the second semiconductor integrated circuit chip 20. However, for example, micro-bumps, Au stud bumps, and the like may be formed. The first semiconductor integrated circuit chips and second semiconductor integrated circuit chips may be connected to each other by thermocompressing bonding through, for example, an anisotropic conductive film (ACF).

The embodiments have exemplified the optoelectronic integrated package module which is electrically connected to the outside. However, the optoelectronic integrated package module may be optically connected to the outside. In addition, the embodiments have exemplified the optoelectronic integrated package module which can perform both transmission and reception. However, the optoelectronic integrated package module may be a module which can perform either transmission or reception. Furthermore, the manufacturing methods exemplified by the embodiments are merely examples, and the film thicknesses, shapes, techniques, materials, and the like may be changed as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optoelectronic integrated package module comprising:
    a silicon interposer formed on a silicon substrate, the interposer including an electrical interconnection and an optical waveguide;
    an optical semiconductor element formed in the silicon interposer, the optical semiconductor element being electrically connected to the electrical interconnection and optically coupled to the optical waveguide; and
    a semiconductor integrated circuit chip module including a first semiconductor integrated circuit chip including a logic circuit and a second semiconductor integrated circuit chip configured to drive the optical semiconductor element, the second semiconductor integrated circuit chip including a via interconnection formed inside from a first principal surface side with a second principal surface side opposite to the first principal surface side being mounted on the silicon interposer, and the first semiconductor integrated circuit chip being mounted on the first principal surface side of the second semiconductor integrated circuit chip,
    wherein the first semiconductor integrated circuit chip and the second semiconductor integrated circuit chip are connected to each other via the via interconnection, and
    one of the first semiconductor integrated circuit chip and the second semiconductor integrated circuit chip receives an electrical signal obtained via the via interconnection by means of an unterminated reception circuit.

2. The package module of claim 1, wherein a length of the electrical interconnection configured to connect the second semiconductor integrated circuit chip to the optical semiconductor element is not more than 1/10 of a signal wavelength at a transmission rate of the electrical signal.

3. The package module of claim 1, wherein the semiconductor integrated circuit chip module is mounted on the silicon interposer so as to overlap the optical semiconductor element when viewed from above.

4. The package module of claim 1, wherein the optical semiconductor element is formed in contact with the silicon substrate.

5. The package module of claim 1, wherein the optical semiconductor element is placed outside the semiconductor integrated circuit chip module when viewed from above.

6. The package module of claim 1, wherein the first semiconductor integrated circuit chip includes a transmission circuit, the second semiconductor integrated circuit chip includes a reception circuit, and the transmission circuit of the first semiconductor integrated circuit chip is DC-coupled to the reception circuit of the second semiconductor integrated circuit chip.

7. The package module of claim 1, wherein the first semiconductor integrated circuit chip includes a transmission circuit, the second semiconductor integrated circuit chip includes a reception circuit, and the transmission circuit of the first semiconductor integrated circuit chip is capacitively coupled to the reception circuit of the second semiconductor integrated circuit chip.

8. The package module of claim 1, wherein the second semiconductor integrated circuit chip has a larger external size than the first semiconductor integrated circuit chip.

9. The package module of claim 1, wherein a through silicon electrode and a soldering bump which are connected to the electrical interconnection are formed in and on the silicon interposer, and
    an upper surface side of the interposer is molded with a resin so as to cover the first semiconductor integrated circuit chip and the second semiconductor integrated circuit chip.

10. An optoelectronic integrated package module comprising:
    a silicon interposer formed on a silicon substrate, the interposer including an electrical interconnection and an optical waveguide;
    a light-emitting element formed in the silicon interposer, the light-emitting element being electrically connected to the electrical interconnection and optically coupled to the optical waveguide;
    a light-receiving element formed in the silicon interposer so as to be spaced apart from the light-emitting element, the light-receiving element being electrically connected to the electrical interconnection and optically coupled to the optical waveguide;
    a first semiconductor integrated circuit chip module including a first semiconductor integrated circuit chip including a logic circuit and a second semiconductor integrated circuit chip configured to drive the light-emitting element, the first semiconductor integrated circuit chip being mounted on a first principal surface side of the second semiconductor integrated circuit chip, and the second semiconductor integrated circuit chip including a first via interconnection formed inside from the first principal surface, having a second principal surface, opposite to the first principal surface, mounted on the silicon interposer, receiving an electrical signal transmitted from the first semiconductor integrated circuit chip, and driving the light-emitting element based on the electrical signal,
    a second semiconductor integrated circuit chip module including a third semiconductor integrated circuit chip including a logic circuit and a fourth semiconductor integrated circuit chip configured to be connected to the light-emitting element, the third semiconductor integrated circuit chip being mounted on a third principal surface side of the fourth semiconductor integrated circuit chip, and the fourth semiconductor integrated circuit chip including a second via interconnection formed inside from the third principal surface, having a fourth principal surface, opposite to the third principal surface, mounted on the silicon interposer, and transmitting an electrical signal obtained by the light-receiving element to the third semiconductor integrated circuit chip, wherein the first semiconductor integrated circuit chip and the second semiconductor integrated circuit chip are electrically connected to each other via the first via interconnection, and the third semiconductor integrated circuit chip and the fourth semiconductor integrated circuit chip are electrically connected to each other via the second via interconnection, and the second semiconductor integrated circuit chip receives an electrical signal obtained via the first via interconnection by means of an unterminated reception circuit, and the third semiconductor integrated circuit chip receives an electrical signal obtained via the second via interconnection by means of an unterminated reception circuit.

11. The package module of claim 10, wherein a length of the electrical interconnection configured to connect the second semiconductor integrated circuit chip to the light-emitting element is not more than 1/10 of a signal wavelength at a transmission rate of the electrical signal, and a length of the electrical interconnection configured to connect the fourth semiconductor integrated circuit chip to the light-receiving element is not more than 1/10 of a signal wavelength at a transmission rate of the electrical signal.

12. The package module of claim 10, wherein the first semiconductor integrated circuit chip module is mounted on the silicon interposer so as to overlap the light-emitting element when viewed from above, and the second semiconductor integrated circuit chip module is mounted on the silicon interposer so as to overlap the light-receiving element when viewed from above.

13. The package module of claim 10, wherein the light-emitting element and the light-receiving element are formed in contact with the silicon substrate.

14. The package module of claim 10, wherein the light-emitting element is placed outside the first semiconductor integrated circuit chip module when viewed from above, and the light-receiving element is placed outside the second semiconductor integrated circuit chip module when viewed from above.

15. The package module of claim 10, wherein the first semiconductor integrated circuit chip includes a transmission circuit, the second semiconductor integrated circuit chip includes a reception circuit, and the transmission circuit of the first semiconductor integrated circuit chip is DC-coupled to the reception circuit of the second semiconductor integrated circuit chip.

16. The package module of claim 10, wherein the first semiconductor integrated circuit chip includes a transmission circuit, the second semiconductor integrated circuit chip includes a reception circuit, and the transmission circuit of the first semiconductor integrated circuit chip is capacitively coupled to the reception circuit of the second semiconductor integrated circuit chip.

17. The package module of claim 10, wherein the second semiconductor integrated circuit chip has a larger external size than the first semiconductor integrated circuit chip.

18. The package module of claim 10, wherein a through silicon electrode and a soldering bump which are connected to the electrical interconnection are formed in and on the silicon interposer, and an upper surface side of the interposer is molded with a resin so as to cover the first semiconductor integrated circuit chip and the second semiconductor integrated circuit chip.

19. A method of manufacturing an optoelectronic integrated package module, the method comprising:

forming a silicon interposer on a silicon substrate, the silicon interposer including an electrical interconnection, an optical waveguide, and an optical semiconductor element electrically connected to the electrical interconnection and optically coupled to the optical waveguide;

forming a semiconductor integrated circuit chip module by mounting a first semiconductor integrated circuit chip including a logic circuit on a first principal surface of a second semiconductor integrated circuit chip including a via interconnection formed inside from the first principal surface and configured to drive the optical semiconductor element so as to electrically connect the first semiconductor integrated circuit chip to the second semiconductor integrated circuit chip via the via interconnection, with one of the first semiconductor integrated circuit chip and the second semiconductor integrated circuit chip receiving an electrical signal via the via interconnection by means of an unterminated reception circuit; and mounting the semiconductor integrated circuit chip module on the silicon interposer, with a second principal surface side opposite to the first principal surface of the second semiconductor integrated circuit chip facing downward.

* * * * *